United States Patent
Kudoh et al.

(10) Patent No.: US 9,306,081 B2
(45) Date of Patent: Apr. 5, 2016

(54) SOLAR CELL MODULE

(71) Applicant: SANYO Electric Co., Ltd., Osaka (JP)

(72) Inventors: Yoshiyuki Kudoh, Shiga (JP); Yousuke Ishii, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/554,589

(22) Filed: Nov. 26, 2014

(65) Prior Publication Data

US 2015/0075591 A1 Mar. 19, 2015

Related U.S. Application Data

(63) Continuation of application No. PCT/JP2013/067313, filed on Jun. 25, 2013.

(30) Foreign Application Priority Data

Jun. 25, 2012 (JP) ................. 2012-141819

(51) Int. Cl.
*H02N 6/00* (2006.01)
*H01L 31/042* (2014.01)
*H01L 31/02* (2006.01)
*H01L 31/05* (2014.01)
*H01L 31/048* (2014.01)

(52) U.S. Cl.
CPC .......... *H01L 31/0201* (2013.01); *H01L 31/048* (2013.01); *H01L 31/0516* (2013.01); *Y02E 10/50* (2013.01)

(58) Field of Classification Search
CPC ....................... H01L 31/0201; H01L 31/02008
See application file for complete search history.

(56) References Cited

U.S. PATENT DOCUMENTS

| 6,218,606 B1 * | 4/2001 | Morizane .............. H01L 31/048 136/244 |
| 6,670,787 B2 | 12/2003 | Tachibana | |
| 2003/0005955 A1 * | 1/2003 | Shiotsuka ......... H01L 31/02008 136/251 |
| 2003/0006730 A1 | 1/2003 | Tachibana | |
| 2008/0053511 A1 * | 3/2008 | Nakamura .......... H01L 31/0504 136/244 |

(Continued)

FOREIGN PATENT DOCUMENTS

JP 2003-086820 A 3/2003
JP 2009-043842 A 2/2009

(Continued)

*Primary Examiner* — Eli Mekhlin
(74) *Attorney, Agent, or Firm* — Marvin A. Motsenbocker; Mots Law, PLLC

(57) ABSTRACT

Second wiring member includes a first wiring-member piece electrically connected to one of the solar cells of one of the adjacent solar cell strings, and a second wiring-member piece electrically connecting the first wiring-member piece to another one of the solar cell strings. First wiring-member piece includes wiring electrically connecting the solar cell and the second wiring-member piece to each other, a first insulating layer covering part of a surface of the wiring on a solar-cell side, and a second insulating layer covering part of a surface of the wiring on a side opposite from the solar cell. First portion of the wiring is exposed from the first insulating layer. Second portion of the wiring is exposed from the second insulating layer. First portion of the wiring is electrically connected to the solar cell, and the second portion of the wiring is electrically connected to the second wiring-member piece.

7 Claims, 3 Drawing Sheets

(56) References Cited

U.S. PATENT DOCUMENTS

| | | |
|---|---|---|
| 2008/0083453 A1 | 4/2008 | Rose et al. |
| 2008/0196757 A1* | 8/2008 | Yoshimine ...... H01L 31/022425 136/244 |
| 2009/0139557 A1* | 6/2009 | Rose .................. H01L 31/0516 136/244 |
| 2011/0155203 A1 | 6/2011 | Funakoshi |

FOREIGN PATENT DOCUMENTS

| | | |
|---|---|---|
| JP | 2010-506401 A | 2/2010 |
| JP | 2011-505693 A | 2/2011 |

* cited by examiner

SOLAR CELL MODULE

CROSS REFERENCE TO RELATED APPLICATIONS

This application is a continuation application of International Application No. PCT/JP2013/067313, filed on Jun. 25, 2013, entitled "SOLAR CELL MODULE", which claims priority based on Article 8 of Patent Cooperation Treaty from prior Japanese Patent Applications No. 2012-141819, filed on Jun. 25, 2012, the entire contents of which are incorporated herein by reference.

TECHNICAL FIELD

The invention relates to a solar cell module.

BACKGROUND ART

In recent years, solar cell modules have drawn increasing attention as an environmentally-friendly energy source. For example, Japanese Patent Application Publication No. 2009-43842 (Patent Document 1) describes a solar cell module including multiple electrically-connected solar cell strings each including multiple electrically-connected solar cells. In the solar cell module described in Patent Document 1, each solar cell string has a flexible printed circuit board and solar cells which are placed on the flexible printed circuit board and electrically connected to one another by wiring provided on the flexible printed circuit board. In each solar cell string, end portions of the flexible printed circuit board are bent. Adjacent solar cell strings are electrically connected to each other by electrically connecting the bent portions of their respective flexible printed circuit boards with a wiring member (interconnector).

SUMMARY OF THE INVENTION

As described above, in the solar cell module described in Patent Document 1, the flexible printed circuit boards are bent so as to electrically connect adjacent solar cell strings together. At the bent portions of the flexible printed circuit boards, however, the wiring might be cut, or the electrical resistivity might increase. This may lower the reliability of the solar cell module.

A solar cell module according to the embodiment includes multiple solar cell strings and a second wiring member. Multiple solar cell strings each include multiple solar cells and a first wiring member. The multiple solar cells are arranged in a first direction. The first wiring member electrically connects the multiple solar cells together. The multiple solar cell strings are arranged in a second direction intersecting the first direction. The second wiring member electrically connects together the solar cell strings adjacent in the second direction. The second wiring member includes a first wiring-member piece and a second wiring-member piece. The first wiring-member piece is electrically connected to a certain one of the solar cells of one of the adjacent solar cell strings. The second wiring-member piece electrically connects the first wiring-member piece to another one of the solar cell strings. The first wiring-member piece includes wiring, a first insulating layer, and a second insulating layer. The wiring electrically connects the solar cell and the second wiring-member piece to each other. The first insulating layer covers part of a surface of the wiring on a solar-cell side. The second insulating layer covers part of a surface of the wiring on a side opposite from the solar cell. The first and second insulating layers are provided such that one portion of the wiring is exposed from the first insulating layer, and another portion of the wiring is exposed from the second insulating layer. The one portion of the wiring is electrically connected to the solar cell, and the other portion of the wiring is electrically connected to the second wiring-member piece.

EMBODIMENTS

Figure 1:
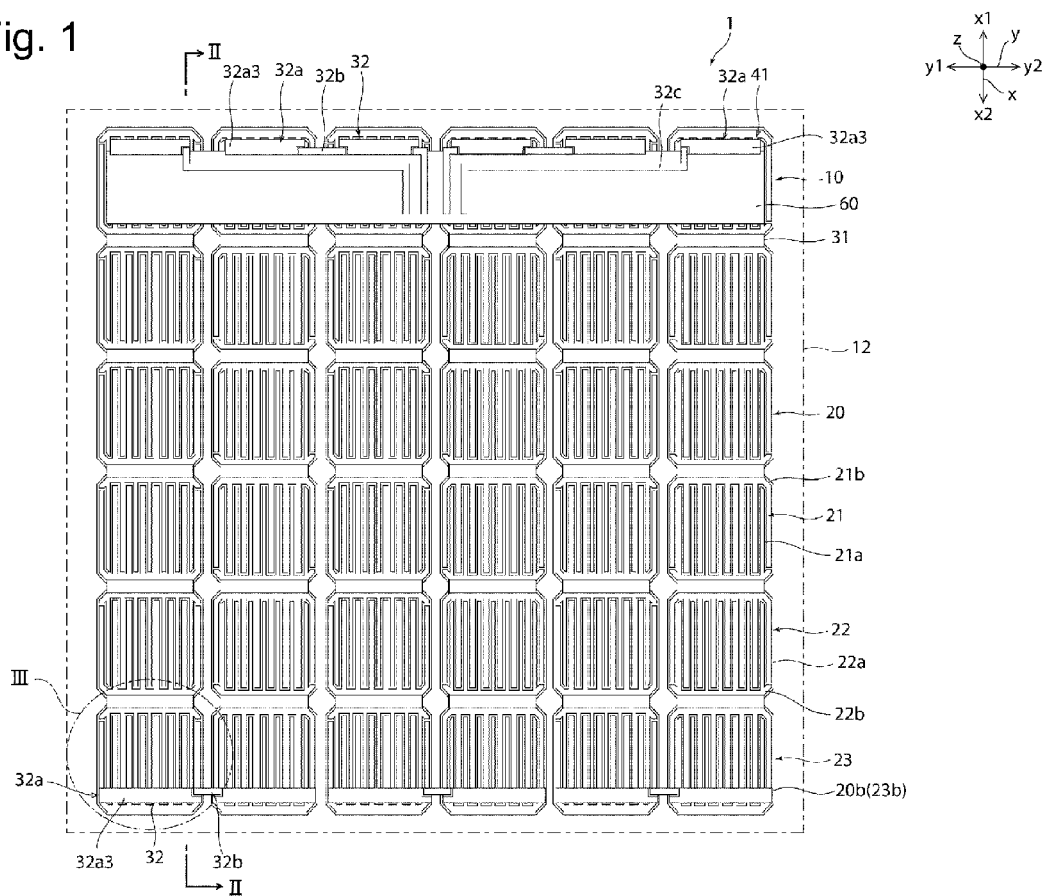
FIG. 1 is a schematic plan view of a solar cell module according to one embodiment.

Hereinafter, examples of preferred embodiments are described. It should be noted that the following embodiments are provided just for illustrative purposes. The invention should not be limited at all to the following embodiments.

In the drawings referred to in the embodiments and other parts, components having substantially the same function are referred to with the same reference numeral. In addition, the drawings referred to in the embodiments and other parts are illustrated schematically, and the dimensional ratio and the like of objects depicted in the drawings are different from those of actual objects in some cases. The dimensional ratio and the like of objects are also different among the drawings in some cases. The specific dimensional ratio and the like of objects should be determined with the following description taken into consideration.

Figure 2:
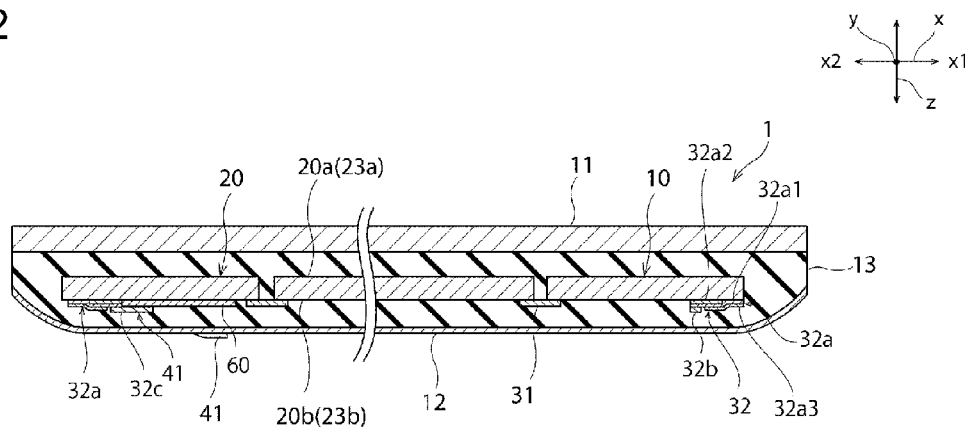
FIG. 2 is a schematic sectional view taken along line II-II in FIG. 1.

As illustrated in FIGS. 1 and 2, solar cell module 1 includes multiple solar cell strings 10. As illustrated in FIG. 2, multiple solar cell strings 10 are placed between first protection member 11 and second protection member 12. First protection member 11 is located on a side where light receiving surfaces 20a of solar cells 20 are located. Second protection member 12 is located on a side where back surfaces 20b of solar cells 20 are located. Sealing layer 13 is provided between first protection member 11 and second protection member 12. Sealing layer 13 seals multiple solar cell strings 10.

First protection member 11 can be formed of, for example, a transparent member such as a glass substrate or a resin substrate. Second protection member 12 can be formed of, for example, a flexible member such as a resin sheet or a resin sheet having a metal foil therein. Sealing layer 13 can be formed from, for example, an ethylene-vinyl acetate copolymer (EVA) resin, a polyvinyl butyral (PVB) resin, a polyethylene (PE) resin, a polyurethane (PU) resin, or the like.

As illustrated in FIG. 1, multiple solar cell strings 10 each have multiple solar cells 20 arranged in an x-axis direction.

Figure 3:
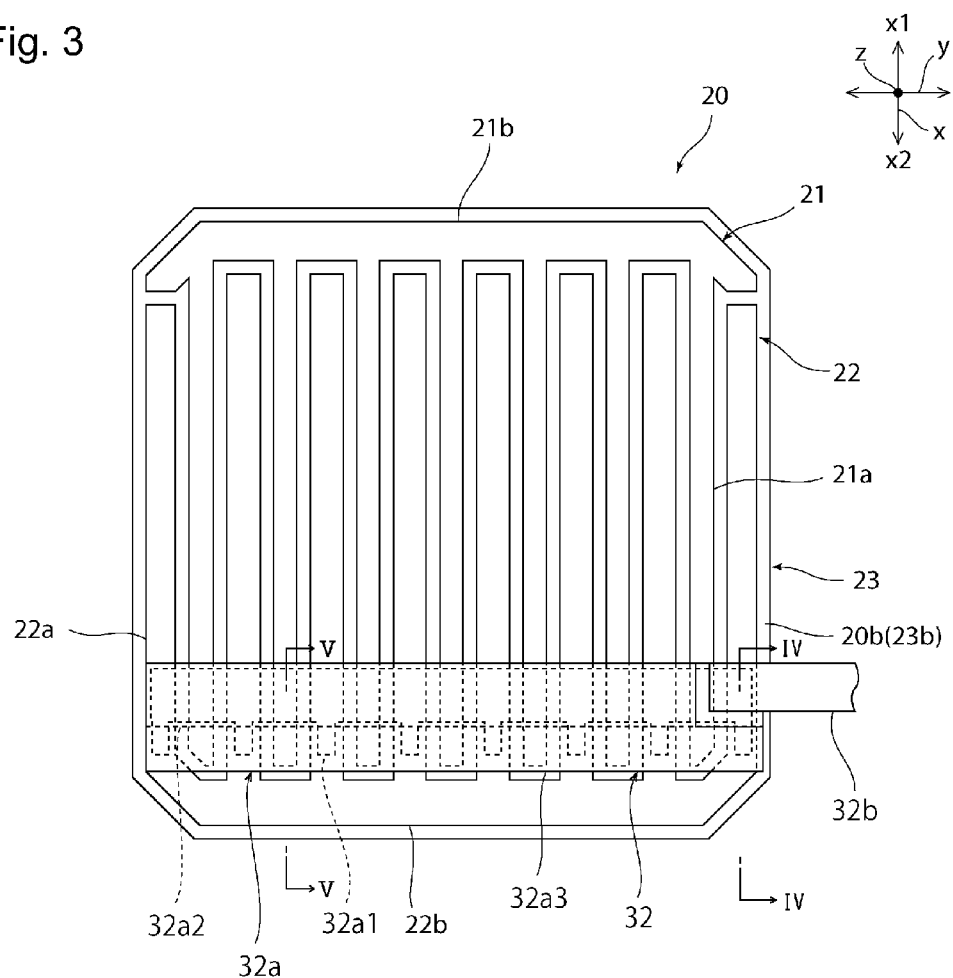
FIG. 3 is a schematic plan view of portion III in FIG. 1.
Figure 4:
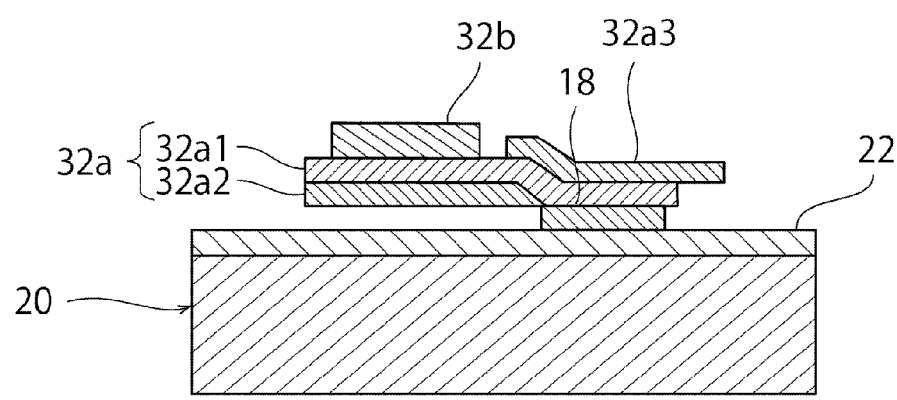
FIG. 4 is a schematic sectional view taken along line IV-IV in FIG. 3.
Figure 5:
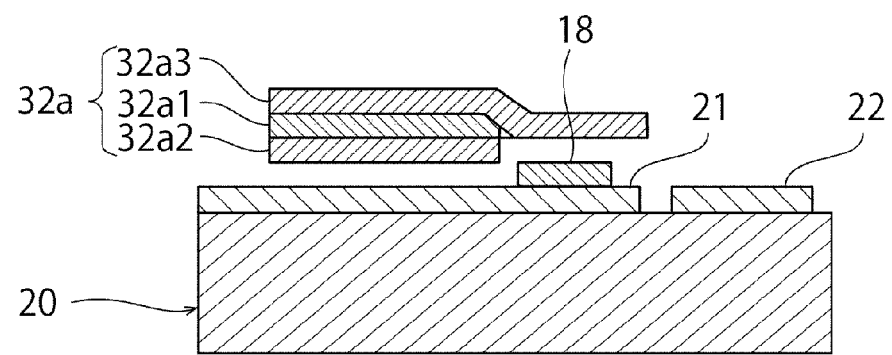
FIG. 5 is a schematic sectional view taken along line V-V in FIG. 3.

As illustrated in FIGS. 1 and 3, each solar cell 20 has photoelectric conversion body 23 and first and second electrodes 21 and 22.

Photoelectric conversion body 23 has first and second main surfaces 23a and 23b. First main surface 23a of photoelectric conversion body 23 forms light-receiving surface 20a of solar cell 20, and second main surface 23b thereof forms back surface 20b of solar cell 20.

Photoelectric conversion body 23 is a member configured to generate carriers such as holes and electrons when receiving light. Photoelectric conversion body 23 may be configured to generate carriers only when receiving light at first main surface 23a, or configured to generate carriers not only when receiving light at first main surface 23a, but also when receiving light at second main surface 23b. In other words, solar cell 20 may be a bifacial solar cell.

The type of photoelectric conversion body 23 is not particularly limited. Photoelectric conversion body 23 can be formed of, for example, a crystal silicon substrate or the like.

First electrode 21 configured to collect either one of holes and electrons and second electrode 22 configured to collect the other one of holes and electrons are placed on second main surface 23b of photoelectric conversion body 23. Hence, solar cell 20 is a back contact solar cell.

The shape of each of first and second electrodes 21 and 22 is not particularly limited. In this embodiment, first and second electrodes 21 and 22 each have a comb shape. First and second electrodes 21 and 22 are placed such that they interdigitate with each other. Specifically, first electrode 21 has multiple finger portions 21a and bus bar portion 21b, and second electrode 22 has multiple finger portions 22a and bus bar portion 22b. Multiple finger portions 21a, 22a extend in the x-axis direction. Multiple finger portions 21a, 22a are arranged with spaces in between in a y-axis direction perpendicular to the x-axis direction.

Multiple finger portions 21a are electrically connected to bus bar portion 21b. Bus bar portion 21b is placed on one side (x1 side) of multiple finger portions 21a in the x-axis direction. Bus bar portion 21b is provided at an end portion of solar cell 20 on the x1 side in the x-axis direction, and extends in the y-axis direction from an end portion on one side to an end portion on the other side.

Similarly, multiple finger portions 22a are electrically connected to bus bar portion 22b. Bus bar portion 22b is placed on the other side (x2 side) of multiple finger portions 22a in the x-axis direction. Bus bar portion 22b is provided at an end portion of solar cell 20 on the x2 side in the x-axis direction, and extends in the y-axis direction from an end portion on one side to an end portion on the other side.

As illustrated in FIGS. 1 and 2, in each solar cell string 10, multiple solar cells 20 are electrically connected to one another with first wiring members 31. Specifically, each first wiring member 31 electrically connects first electrode 21 of one of solar cells 20 adjacent in the x-axis direction to second electrode 22 of the other one of the solar cells.

First wiring member 31 can be formed of, for example, a flexible printed circuit (FPC) board having a metal foil made of Ag, Cu, or the like, a stack of metal foils, a metal foil whose surface is coated with solder or the like, an insulating film, and wiring placed on the insulating film.

First wiring member 31 is bonded to back surface 20b of solar cell 20 by adhesive layer 18. Adhesive layer 18 can be formed from, for example, a hardened resin adhesive, a hardened resin adhesive having a conductive material dispersedly mixed therein, solder, or other resin.

Multiple solar cell strings 10 are arranged with spaces in between in the y-axis direction intersecting (or typically orthogonal to) the x-axis direction.

Solar cell strings 10 adjacent in the y-axis direction are electrically connected to each other with second wiring member 32. Specifically, second wiring member 32 electrically connects together endmost solar cells 20 on the x1 side or the x2 side of respective solar cell strings 10 adjacent in the y-axis direction. Second wiring member 32 has first wiring-member piece 32a and second wiring-member piece 32b. First wiring-member piece 32a is electrically connected to solar cell 20. First wiring-member piece 32a is bonded to solar cell 20 by, for example, resin adhesive layer 18 containing a hardened resin adhesive. Resin adhesive layer 18 may contain a conductive material.

As illustrated in FIGS. 2 and 3, at least part of first wiring-member piece 32a is placed on solar cell 20. Specifically, in this embodiment, substantially the entire portion of first wiring-member piece 32a is placed on solar cell 20. As illustrated in FIGS. 2 to 5, first wiring-member piece 32a has wiring 32a1, first insulating layer 32a2, and second insulating layer 32a3.

Wiring 32a1 can be formed of, for example, a metal foil made of copper, copper alloys, or the like. Wiring 32a1 electrically connects solar cell 20 and second wiring-member piece 32b to each other. Specifically, wiring 32a1 is electrically connected to first or second finger portions 21a or 22a of solar cell 20, and is also electrically connected to second wiring-member piece 32b.

First insulating layer 32a2 covers part of a surface of wiring 32a1 on the solar cell 20 side. On the other hand, second insulating layer 32a3 covers part of a surface of wiring 32a1 on the opposite side from solar cell 20. First and second insulating layers 32a2 and 32a3 are provided such that a portion of wiring 32a1 is exposed from first insulating layer 32a2, and another portion of wiring 32a1 is exposed from second insulating layer 32a3. Wiring 32a1 is electrically connected to solar cell 20 at the portion which is on the surface of wiring 32a1 on the solar cell 20 side and is exposed from first insulating layer 32a2.

Part of first insulating layer 32a2 and part of second insulating layer 32a3 preferably face each other with wiring 32a1 interposed therebetween. This can increase the strength of first wiring-member piece 32a. In addition, preferably, the portion of wiring 32a1 exposed from first insulating layer 32a2 does not overlap the other portion of wiring 32a1 exposed from second insulating layer 32a3 on an XY plane. This can increase the strength of first wiring-member piece 32a.

Each of first and second insulating layers 32a2 and 32a3 can be formed from, for example, an insulating resin, an inorganic oxide, or the like.

First wiring-member piece 32a connected to solar cell 20 of one of adjacent solar cell strings 10 and first wiring-member piece 32a connected to solar cell 20 of the other one of solar cell strings 10 are electrically connected to each other via second wiring-member piece 32b. Second wiring-member piece 32b is electrically connected to wiring 32a1 of first wiring-member piece 32a at the portion which is on the surface opposite from solar cell 20 and is exposed from second insulating layer 32a3.

Second wiring-member piece 32b can be formed of a metal foil made of copper, copper alloys, or the like. First wiring-member piece 32a and second wiring-member piece 32b are connected together by, for example, solder.

Second wiring-member piece 32b is provided in a region where solar cells 20 are provided. In other words, second wiring-member piece 32b electrically connects first wiring-member pieces 32a together in a region where solar cells 20 are provided. By thus placing first and second wiring-member pieces 32a and 32b in a region where solar cells 20 are provided, solar cell module 1 can be reduced in size.

Solar cell module 1 has lead wiring 41. Lead wiring 41 is electrically connected to solar cell string 10, and is drawn to the outside of sealing layer 13.

Lead wiring 41 has first wiring-member piece 32a described above and third wiring-member piece 32c. Insulating sheet 60 is placed between third wiring-member piece 32c and solar cell 20. Insulating sheet 60 can be formed from, for example, a polyimide resin, a polyethylene terephthalate (PET) resin, an ethylene-vinyl acetate copolymer (EVA) resin, a polyvinyl butyral (PVB) resin, a polyethylene (PE) resin, a polyurethane (PU) resin, or the like.

Third wiring-member piece 32c is electrically connected to wiring 32a1 of first wiring-member piece 32a at the portion which is on the surface opposite from solar cell 20 and is exposed from second insulating layer 32a3. Third wiring-member piece 32c is drawn to the outside of sealing layer 13. Third wiring-member piece 32c can be formed of a metal foil made of copper, copper alloys, or the like. Third wiring-member piece 32c and wiring 32a1 can be electrically connected to each other by, for example, solder or the like.

As described thus far, in this embodiment, second wiring-member piece 32b or third wiring-member piece 32c is connected to solar cell 20 by use of first wiring-member piece 32a whose wiring 32a1 has one portion exposed on the surface on the solar cell 20 side and another portion exposed on the surface opposite from solar cell 20. For this reason, the wiring member does not need to be bent or curved, making it unlikely for wiring 32a1 to be cut. Hence, solar cell module 1 with improved reliability can be obtained.

The portion of wiring 32a1 exposed from second insulating layer 32a3 may be provided axisymmetrically with respect to a center axis extending in a direction perpendicular to the direction in which first wiring-member piece 32a extends. Multiple portions of wiring 32a1 may be exposed from second insulating layer 32a3. In other words, the shapes and sizes of first and second insulating layers 32a2 and 32a3 are not particularly limited as long as undesired short circuit does not occur.

In this way, the embodiments described above provide solar cell modules with improved reliability.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A solar cell module comprising:
  a plurality of solar cell strings each including a plurality of solar cells arranged in a first direction and a first wiring member electrically connecting the plurality of solar cells together, the plurality of solar cell strings arranged in a second direction intersecting the first direction; and
  a second wiring member electrically connecting together the solar cell strings adjacent in the second direction, wherein
  the second wiring member includes
    a first wiring-member piece electrically connected to a certain one of the solar cells of one of the adjacent solar cell strings, and
    a second wiring-member piece electrically connecting the first wiring-member piece to another one of the solar cell strings,
  the first wiring-member piece includes
    wiring electrically connecting the solar cell and the second wiring-member piece to each other,
    a first insulating layer covering part of a surface of the wiring on a solar-cell side, and
    a second insulating layer covering part of a surface of the wiring on a side opposite from the solar cell, wherein
  first portion of the wiring is exposed from the first insulating layer and is covered with the second insulating layer, and
  second portion of the wiring is exposed from the second insulating layer and is covered with the first insulating layer, and
  the first portion of the wiring is electrically connected to the solar cell, and the second portion of the wiring is electrically connected to the second wiring-member piece.

2. The solar cell module according to claim 1, wherein
  at least part of the first wiring-member piece is placed on the solar cell, and
  the second wiring-member piece electrically connects two or more first wiring-member pieces together in a region where the solar cells are provided.

3. The solar cell module according to claim 1, wherein the second wiring-member piece is formed of a metal foil.

4. The solar cell module according to claim 1, wherein part of the first insulating layer and part of the second insulating layer face each other with the wiring interposed therebetween.

5. The solar cell module according to claim 1, further comprising:
  a sealing layer sealing the plurality of solar cell strings; and wherein
  the first wiring-member piece is configured as part of a lead wiring electrically connected to the solar cell strings and drawn to an outside of the sealing layer, wherein
  the lead wiring further comprises
    a third wiring-member piece electrically connected to the wiring of the first wiring-member piece at a portion exposed from the second insulating layer, the third wiring-member piece being drawn to the outside of the sealing layer.

6. The solar cell according to claim 1, wherein each of the solar cells includes
  a photoelectric conversion body, and
  first and second electrodes placed on one main surface of the photoelectric conversion body.

7. A solar cell module comprising:
  a plurality of solar cell strings each including a plurality of solar cells arranged in a first direction and a first wiring member electrically connecting the plurality of solar cells together, the plurality of solar cell strings arranged in a second direction intersecting the first direction; and
  a second wiring member electrically connecting together the solar cell strings adjacent in the second direction, wherein
  the second wiring member includes
    a first wiring-member piece electrically connected to a certain one of the solar cells of one of the adjacent solar cell strings, and
    a second wiring-member piece electrically connecting the first wiring-member piece to another one of the solar cell strings,
  the first wiring-member piece includes
    wiring electrically connecting the solar cell and the second wiring-member piece to each other,
    a first insulating layer covering part of a surface of the wiring on a solar-cell side, and
    a second insulating layer covering part of a surface of the wiring on a side opposite from the solar cell, wherein
  first portion of the wiring is exposed from the first insulating layer and is covered with the second insulating layer, and second portion of the wiring is exposed from the second insulating layer and is covered with the first insulating layer, and the first portion of the wiring is electrically connected to the solar cell, and the second portion of the wiring is electrically connected to the second wiring-member piece, wherein the solar cell and the first wiring-member piece are bonded together by a resin adhesive layer, and the first wiring-member piece and the second wiring-member piece are joined together by solder.

* * * * *